(12) United States Patent
Liang et al.

(10) Patent No.: US 8,081,008 B2
(45) Date of Patent: Dec. 20, 2011

(54) SYSTEM AND METHOD FOR TESTING A CHARACTERISTIC IMPEDANCE OF AN ELECTRONIC COMPONENT

(75) Inventors: Hsien-Chuan Liang, Taipei Hsien (TW); Shen-Chun Li, Taipei Hsien (TW); Yung-Chieh Chen, Taipei Hsien (TW); Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 293 days.

(21) Appl. No.: 12/605,434

(22) Filed: Oct. 26, 2009

(65) Prior Publication Data

US 2010/0277198 A1 Nov. 4, 2010

(30) Foreign Application Priority Data

Apr. 30, 2009 (CN) .......................... 2009 1 0301998

(51) Int. Cl.
*G01R 31/20* (2006.01)

(52) U.S. Cl. .................................................. 324/754.11
(58) Field of Classification Search .................. None
See application file for complete search history.

(56) References Cited

U.S. PATENT DOCUMENTS

| 6,891,392 B2 * | 5/2005 | Nagar et al. ............. 324/755.07 |
| 2007/0074905 A1 * | 4/2007 | Lin et al. ........................ 174/263 |
| 2008/0309354 A1 * | 12/2008 | Hsu ................................. 324/705 |
| 2010/0332169 A1 * | 12/2010 | Liang et al. ...................... 702/65 |

* cited by examiner

*Primary Examiner* — Jermele M Hollington
(74) *Attorney, Agent, or Firm* — Altis Law Group, Inc.

(57) ABSTRACT

A method for testing a characteristic impedance of an electronic component includes sending a positioning command to a control computer through a switch, so as to drive a probe holder of a mechanical arm to position probes of a time domain reflectometer (TDR) on a position of the electronic component. The method further receives measured data collected by the TDR, and compares the measured data with preset standard values to determine if the measured data is acceptable.

20 Claims, 3 Drawing Sheets

SYSTEM AND METHOD FOR TESTING A CHARACTERISTIC IMPEDANCE OF AN ELECTRONIC COMPONENT

BACKGROUND

1. Technical Field

Embodiments of the present disclosure relate to test technology, and particularly to a system and method for testing a characteristic impedance of an electronic component.

2. Description of Related Art

Signal testing of components on the electronic device (e.g., a motherboard) is an important phase in the manufacturing process and is closely interrelated to product quality. In one example, the signal testing of characteristic impedances of the components on the electronic devices may be operated manually using a time domain reflectometer (TDR). In recent years, a mechanical arm has been used to control a movement of an object automatically. However, further improvements are desirable to improve signal testing. Therefore, prompt and accurate test of characteristic impedances of the components on the electronic device using the mechanical arm is desirable.

DETAILED DESCRIPTION

All of the processes described below may be embodied in, and fully automated via, functional code modules executed by one or more general purpose computers or processors. The code modules may be stored in any type of readable medium or other storage device. Some or all of the methods may alternatively be embodied in specialized hardware. Depending on the embodiment, the readable medium may be a hard disk drive, a compact disc, a digital video disc, or a tape drive.

Figure 1:
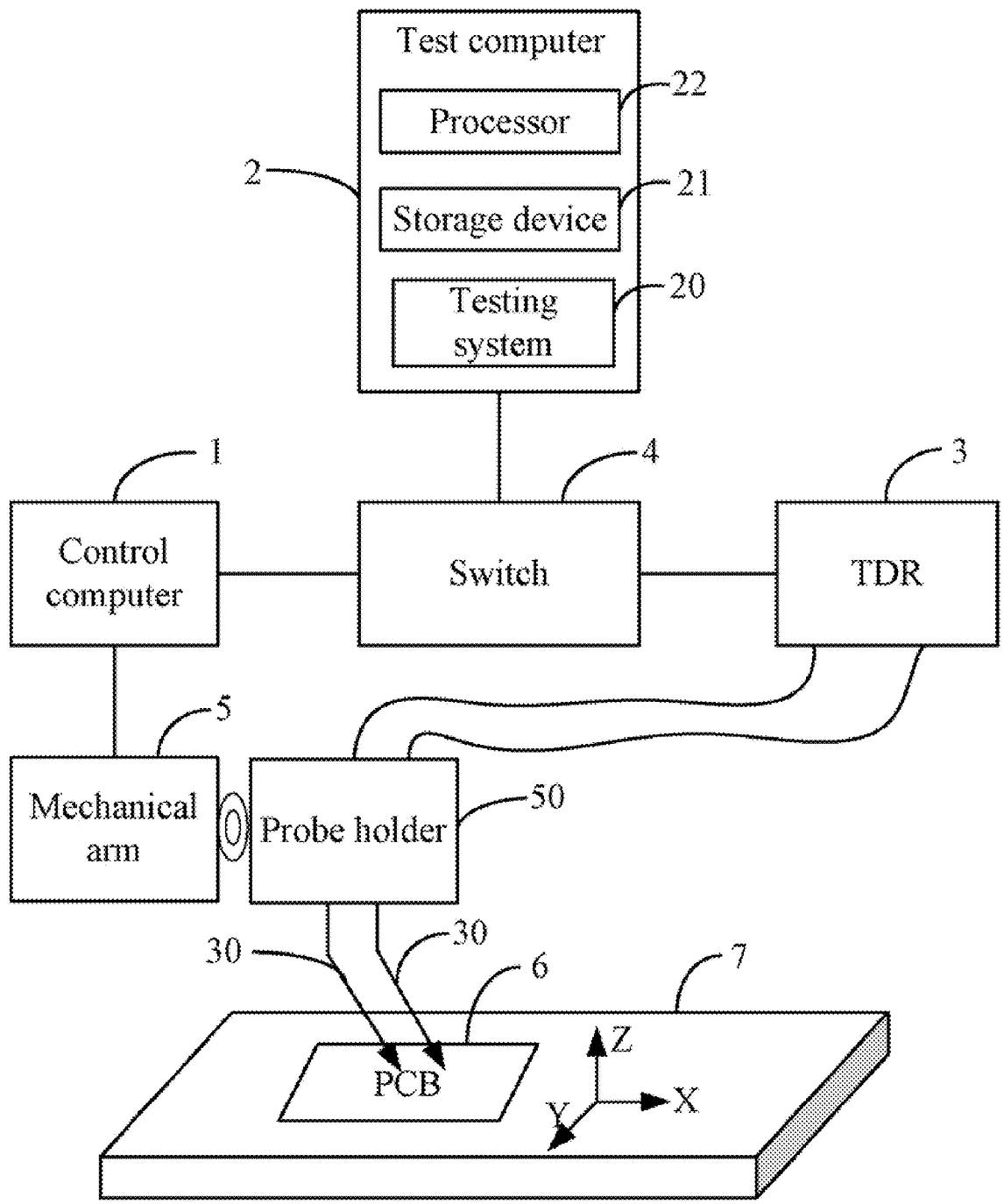
FIG. 1 is a schematic diagram of one embodiment of a test computer comprising a system for testing a characteristic impedance of an electronic component.

FIG. 1 is a schematic diagram of one embodiment of a test computer 2 comprising a testing system 20. In one embodiment, the test computer 2 is connected to a control computer 1 and a time domain reflectometer (TDR) 3 through a switch 4. The control computer 1 is further connected to a mechanical arm 5. A probe holder/rack 50 is configured at an end of the mechanical arm 5. Probes 30 of the TDR 3 are held by the probe holder 50. Referring to FIG. 1, the testing system 20 may be used to test a characteristic impedance of an electronic component on an electronic device 6 by sending a positioning command to the control computer 1 through the switch 4, so as to drive the probes 30 to a to test an electronic component. The TDR 3 collects measured data of the electronic component and sends the measured data to the test computer 2 through the switch 4. The measured data are compared with preset standard values, so as to determine if the measured data are acceptable. A detailed description will be given in the following paragraphs.

The test computer 2 further includes a storage device 21 for storing data, such as test parameters of the electronic components on the electronic device 6. In one embodiment, the test parameters may include coordinates of the electronic component on the electronic device 6, a standard characteristic impedance of each electronic component to be tested, and a preset storing path to store measured data of the electronic components. It should be understood that the electronic component, may comprise a resistor, and inductor, a capacitor, an integrated circuit, or a transistor, for example.

The electronic device 6 is positioned on a test platform 7. In one embodiment, the electronic device 6 may be a motherboard or a printed circuit board (PCB).

Figure 2:
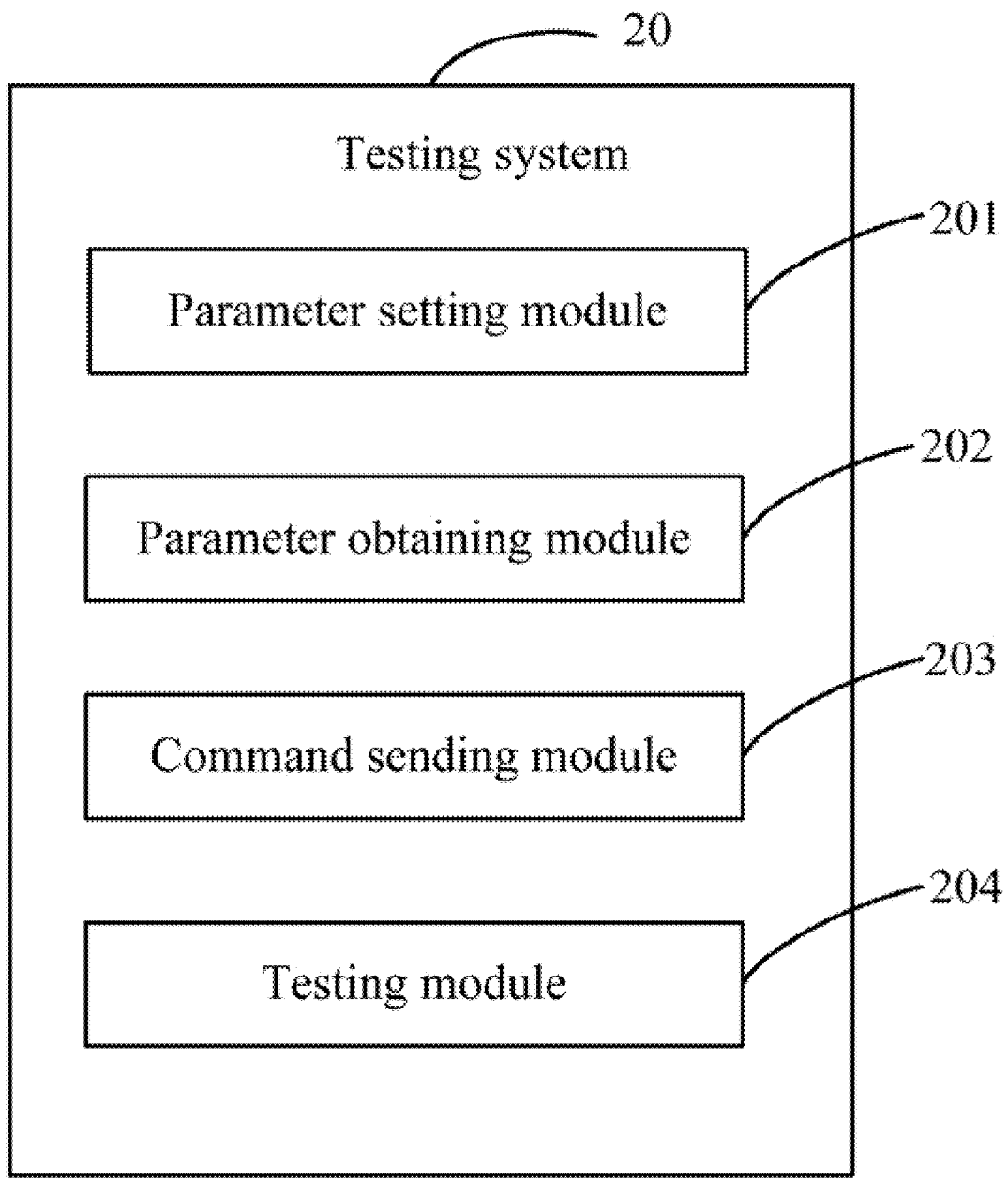
FIG. 2 is a block diagram of one embodiment of a test computer comprising a testing system.

In one embodiment, as shown in FIG. 2, the testing system 20 includes a parameter setting module 201, a parameter obtaining module 202, a command sending module 203, and a testing module 204. In one embodiment, the modules 201-204 comprise one or more computerized instructions that are stored in the storage device 21. A processor 22 of the test computer 2 executes the one or more computerized instructions to implement one or more operations of the test computer 2.

The parameter setting module 201 sets test parameters of the electronic components on the electronic device 6, and stores the test parameters in the storage device 21. As mentioned above, the test parameters may include coordinates of the electronic components on the electronic device 6, a standard characteristic impedance of each electronic component to be tested, and a preset storing path to store measured data of the electronic components.

The parameter obtaining module 202 reads the coordinates of the electronic component when the test starts. In one embodiment, the coordinates of the electronic component are three dimensional coordinates (i.e., the x-y-z coordinates).

The command sending module 203 sends a positioning command to the control computer 1 according to the coordinates of the electronic component on the electronic device 6, so as to position the probes 30 of the TDR 3 to a position of the electronic component. A detailed description is as follows. Firstly, the command sending module 203 calculates a scalar value between the coordinates of the electronic component and an origin of a coordinate system. In one embodiment, the origin of the coordinate system is positioned at a center point of the electronic device 6, and an initial position of the probe holder 50 is positioned at the origin of the coordinate system. Then, the command sending module 203 sends the positioning command to the control computer 1, where the positioning command includes the scalar value between the coordinates of the electronic component and the origin of the coordinate system.

The control computer 1 drives the probe holder 50 of the mechanical arm 5 to position the probes 30 of the TDR 3 to the position of the electronic component according to the positioning command. For example, suppose the coordinate of the electronic component is (10, 12), where a unit is one millimeter. After receiving the positioning command, the control computer 1 drives the probe holder 50 to move the probes 30 along an X-axis of the coordinate system with a distance of 10 millimeters, then move the probes 30 along a Y-axis of the coordinate system with a distance of 12 millimeters, so as to position the probes 30 to the position of the electronic component.

The command sending module 203 further determines if the probes 30 are positioned accurately. In one embodiment, if the test computer 2 receives the characteristic impedance of the component collected by the TDR 3 within a preset time interval (e.g., 5 seconds), the command sending module 203 determines that the probes 30 are positioned accurately. If the test computer 2 does not receive the characteristic impedance of the component collected by the TDR 3 within the preset time interval, the command sending module 203 determines that the probes 30 are not positioned accurately, and outputs a position failure information, then the test procedure ends.

When the probes 30 are positioned accurately, the testing module 204 reads measured data of the characteristic impedance of the electronic component collected by the TDR 3, and stores the measured data in the preset storing path (e.g., E:\PCB\Test).

The testing module 204 further compares the measured data of the electronic component with the standard characteristic impedance of the electronic component, so as to determine if the measured data of the electronic component is acceptable. For example, supposing a range of the standard characteristic impedance of the electronic component is [5, 30], where a unit is one ohm. If the measured data of the characteristic impedance obtained by the TDR 3 is 4.5 ohms, the testing module 204 determines the measured data is not acceptable.

The testing module 204 further generates a test report for storing the measured data and the determined result, and stores the test report according to the preset storing path. The present storing path may include storing the test report in the storage system 21.

In other embodiments, the parameter setting module 201 further sets a repeat count for re-positioning the probes 30 to the position of the electronic component if the probes 30 are not positioned accurately, and sets predetermined move directions for re-positioning the probes 30.

In other embodiments, the command sending module 203 further calculates new coordinates of the electronic component on the electronic device 6 if the probes 30 are not positioned accurately, and sends a positioning command to the control computer 1 according to the new coordinates of the electronic component, so as to drive the probe holder 50 of the mechanical arm 5 to position the probes 30 of the TDR 3 to a new position of the electronic component. If the probes 30 are not positioned accurately when the repeat count reaches, the command sending module 203 outputs position failure information.

A detailed description of calculating new coordinates of the electronic component on the electronic device is as follows. Firstly, the command sending module 203 moves the probes 30 by a preset distance from an X-axis coordinate of a current position of the electronic component along the X-axis according to a predetermined move direction (e.g., a positive axis direction), so as to obtain a new X-axis coordinate of the electronic component. Then, the command sending module 203 moves the probes 30 by the preset distance from a Y-axis coordinate of the current position of the electronic component along the Y-axis according to the predetermined move direction, so as to obtain a new Y-axis coordinate of the electronic component.

For example, suppose the repeat count for re-positioning the probes 30 is twice, and coordinates of the current position of the electronic component is (10, 12), where a unit is one millimeter. At the first time, the command sending module 203 moves the probes 30 by one millimeter from the current position (10, 12) along a positive direction of the X-axis and the Y-axis, so as to obtain a new position (11, 13) of the electronic component. If the probes 30 are not positioned accurately at the new position (11, 13), the command sending module 203 re-positioning the probes 30 at the second time by moving the probes 30 by two millimeters from the current position (11, 13) along a negative direction of the X-axis and the Y-axis, so as to obtain another new position (9, 11) of the electronic component. If the probes 30 are not positioned accurately at the new position (9, 11), the command sending module 203 outputs position failure information, and the test procedure ends.

Figure 3:
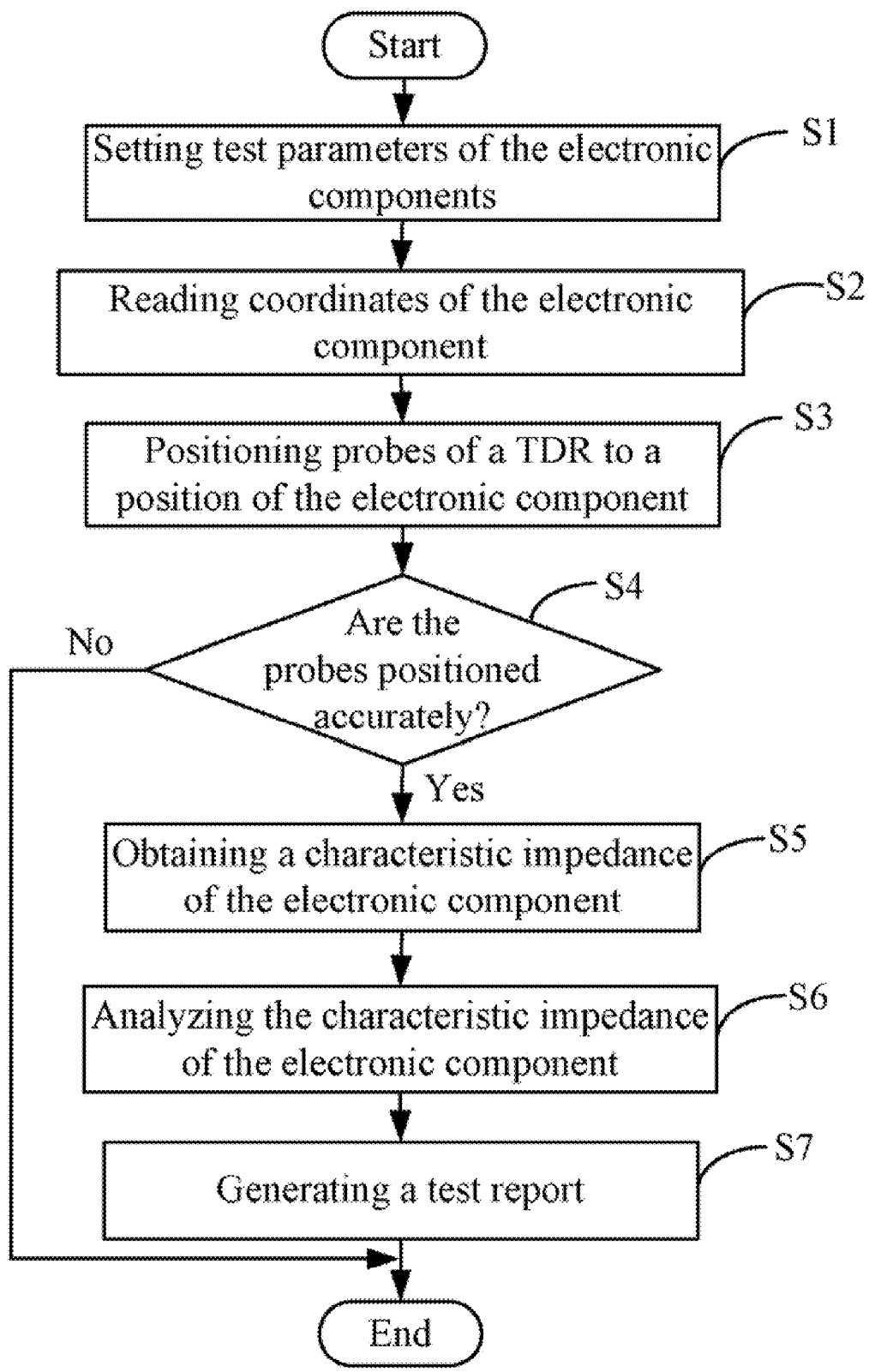
FIG. 3 is a flowchart of one embodiment of a method for testing a characteristic impedance of an electronic component.

FIG. 3 is a flowchart of one embodiment of a method for testing a characteristic impedance of an electronic component. Depending on the embodiment, additional blocks may be added, others removed, and the ordering of the blocks may be changed.

In block S1, the parameter setting module 201 sets test parameters of the electronic components on the electronic device 6, and stores the test parameters in the storage device 21. As mentioned above, the test parameters may include coordinates of the electronic components on the electronic device 6, a standard characteristic impedance of each electronic component to be tested, and a preset storing path to store measured data of the electronic components.

In block S2, the parameter obtaining module 202 reads the coordinates of the electronic component when the test starts.

In block S3, the command sending module 203 sends a positioning command to the control computer 1 according to the coordinates of the electronic component on the electronic device 6, so as to position the probes 30 of the TDR 3 to a position of the electronic component.

Then, in block S3, the control computer 1 drives the probe holder 50 of the mechanical arm 5 to position the probes 30 of the TDR 3 to a position of the electronic component according to the positioning command.

In block S4, the command sending module 203 determines if the probes 30 are positioned accurately. The procedure goes to block S5 if the probes 30 are positioned accurately, or the procedure ends if the probes 30 are not positioned accurately.

In block S5, the testing module 204 reads measured data of the characteristic impedance of the electronic component collected by the TDR 3, and stores the measured data in the preset storing path.

In block S6, the testing module 204 compares the measured data of the electronic component with the standard characteristic impedance of the electronic component, so as to determine if the measured data of the electronic component is acceptable.

In block S7, the testing module 204 generates a test report for storing the measured data and the determined result, and stores the test report according to the preset storing path.

In other embodiments, the method may further include the followed blocks S8-S10.

In block S8, the parameter setting module 201 sets a repeat count for re-positioning the probes 30 to the position of the electronic component if the probes 30 are not positioned accurately, and sets predetermined move directions for re-positioning the probes 30.

In block S9, the command sending module 203 calculates new coordinates of the electronic component on the electronic device 6 if the probes 30 are not positioned accurately, and sends a positioning command to the control computer 1 according to the new coordinates of the electronic component, so as to drive the probe holder 50 of the mechanical arm 5 to position the probes 30 of the TDR 3 to a new position of the electronic component.

In block S10, if the probes 30 are not positioned accurately when the repeat count reaches, the command sending module 203 outputs position failure information.

In this embodiment, for the purpose of illustration, only one electronic component on the electronic device 6 is tested. In other embodiments, if the electronic device 6 includes two or more electronic components to be tested, the command sending module 203 further obtains a coordinate of a next electronic component when a current electronic component has been tested, and calculates a scalar value between the coordinates of the next electronic component and coordinates of the current electronic component. Then, the command sending module 203 sends a positioning command to the control computer 1, where the positioning command includes the scalar value between the coordinates of the next electronic component and the coordinates of the current electronic component. Thus, the control computer 1 drives the probe holder 50 to position the probes 30 on a position of the next electronic component according to the positioning command.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A computer system for testing a characteristic impedance of at least one electronic component of an electronic device, the computer system being connected to a control computer and a time domain reflectometer (TDR) through a switch, and the computer system being further connected to a mechanical arm, the computer system comprising:
   a parameter setting module operable to set test parameters of the at least one electronic component on the electronic device, the test parameters comprising coordinates of the at least one electronic component, a standard characteristic impedance of the at least one electronic component, and a preset storing path to store measured data of the at least one electronic component;
   a parameter obtaining module operable to read the coordinates of the at least one electronic component;
   a command sending module operable to send a positioning command to the control computer according to the coordinates of the at least one electronic component on the electronic device, so as to drive a probe holder of the mechanical arm to position probes of the TDR to a position of the at least one electronic component on the electronic device;
   the command sending module further operable to determine if the probes are positioned accurately;
   a testing module operable to read measured data of the characteristic impedance of the at least one electronic component collected by the TDR, if the probes are positioned accurately;
   the testing module further operable to compare the measured data of the at least one electronic component with the standard characteristic impedance of the at least one electronic component, so as to determine if the measured data of the at least one electronic component is acceptable;
   the testing module further operable to generate a test report for storing the measured data and the determined result, and store the test report according to the preset storing path; and
   at least one processor to execute the parameter setting module, the parameter obtaining module, the command sending module, and the testing module.

2. The system according to claim 1, wherein the command sending module sends a positioning command to the control computer according to the coordinates of the at least one electronic component on the electronic device by:
   calculating a scalar value between the coordinates of the at least one electronic component and an origin of a coordinate system, wherein the origin of the coordinate system is positioned at a center point of the electronic device, and an initial position of the probe holder is positioned at the origin of the coordinate system; and
   sending the positioning command to the control computer, wherein the positioning command comprises the scalar value between the coordinates of the at least one electronic component and the origin of the coordinate system.

3. The system according to claim 1, wherein the command sending module determines if the probes are positioned accurately by:
   determining that the probes are positioned accurately if the computer system receives the characteristic impedance of the at least one electronic component collected by the TDR within a preset time interval; and
   determining that the probes are not positioned accurately if the computer system does not receive the characteristic impedance of the at least one electronic component collected by the TDR within the preset time interval.

4. The system according to claim 1, wherein:
   the parameter setting module further operable to set a repeat count for re-positioning the probes to the position of the at least one electronic component, and set predetermined move directions for re-positioning the probes;
   the command sending module further operable to calculate new coordinates of the at least one electronic component on the electronic device if the probes are not positioned accurately, and send a positioning command to the control computer according to the new coordinates of the at least one electronic component, so as to drive the probe holder of the mechanical arm to position the probes of the TDR to a new position of the at least one electronic component;
   the command sending module further operable to output position failure information if the probes are not positioned accurately when the repeat count reaches.

5. The system according to claim 4, wherein the command sending module calculates new coordinates of the at least one electronic component on the electronic device by:
   moving the probes by a preset distance from an X-axis coordinate of a current position of the at least one electronic component along the X-axis according to a predetermined move direction, so as to obtain a new X-axis coordinate of the at least one electronic component; and
   moving the probes by the preset distance from a Y-axis coordinate of the current position of the at least one electronic component along the Y-axis according to the predetermined move direction, so as to obtain a new Y-axis coordinate of the at least one electronic component.

6. The system according to claim 1, wherein the command sending module further operable to:
   obtain coordinates of a next electronic component when the at least one electronic component has been tested if the electronic device comprises two or more electronic components to be tested, and calculate a scalar value between the coordinates of the next electronic component and coordinates of the at least one electronic component; and
   send a positioning command to the control computer, wherein the positioning command comprises the scalar value between the coordinates of the next electronic component and the coordinates of the at least one electronic component.

7. The system according to claim 1, wherein the electronic device is a motherboard or a printed circuit board.

8. A computer-implemented method for testing a characteristic impedance of at least one electronic component of an electronic device, the method comprising:

setting test parameters of the at least one electronic component on the electronic device, and storing the test parameters in a storage of a test computer, the test parameters comprising coordinates of at least one electronic components, a standard characteristic impedance of the at least one electronic component, and a preset storing path to store measured data of the at least one electronic component;

reading the coordinates of the at least one electronic component by the test computer;

sending a positioning command from the test computer to a control computer through a switch according to the coordinates of the at least one electronic component on the electronic device;

driving a probe holder of a mechanical arm by the control computer according to the positioning command, so as to position probes of a time domain reflectometer (TDR) to a position of the at least one electronic component on the electronic device;

returning measured data of the characteristic impedance of the at least one electronic component collected by the TDR to the test computer through the switch, if the probes are positioned accurately;

comparing the measured data of the at least one electronic component with the standard characteristic impedance of the at least one electronic component, so as to determine if the measured data of the at least one electronic component is acceptable; and generating a test report for storing the measured data and the determined results, and storing the test report according to the preset storing path.

9. The method according to claim 8, wherein sending a positioning command to the control computer according to the coordinates of the at least one electronic component on the electronic device comprises:

calculating a scalar value between the coordinates of the at least one electronic component and an origin of a coordinate system, wherein the origin of the coordinate system is positioned at a center point of the electronic device, and an initial position of the probe holder is positioned at the origin of the coordinate system; and sending the positioning command to the control computer, wherein the positioning command comprises the scalar value between the coordinates of the at least one electronic component and the origin of the coordinate system.

10. The method according to claim 8, wherein a procedure to determine if the probes are positioned accurately comprises:

determining that the probes are positioned accurately if the test computer receives the characteristic impedance of the at least one electronic component collected by the TDR within a preset time interval; and determining that the probes are not positioned accurately if the test computer does not receive the characteristic impedance of the at least one electronic component collected by the TDR within the preset time interval.

11. The method according to claim 8, further comprising:

setting a repeat count for re-positioning the probes to the position of the at least one electronic component, and setting predetermined move directions for re-positioning the probes;

calculating new coordinates of the at least one electronic component on the electronic device if the probes are not positioned accurately, and sending a positioning command to the control computer according to the new coordinates of the at least one electronic component, so as to drive the probe holder of the mechanical arm to position the probes of the TDR to a new position of the at least one electronic component; and outputting position failure information if the probes are not positioned accurately when the repeat count reaches.

12. The method according to claim 11, wherein calculating new coordinates of the at least one electronic component on the electronic device comprises:

moving the probes by a preset distance from an X-axis coordinate of a current position of the at least one electronic component along the X-axis according to a predetermined move direction, so as to obtain a new X-axis coordinate of the at least one electronic component; and moving the probes by the preset distance from a Y-axis coordinate of the current position of the at least one electronic component along the Y-axis according to the predetermined move direction, so as to obtain a new Y-axis coordinate of the at least one electronic component.

13. The method according to claim 8, further comprising:

obtaining coordinates of a next electronic component when the at least one electronic component has been tested if the electronic device comprises two or more electronic components to be tested, and calculating a scalar value between the coordinates of the next electronic component and coordinates of the at least one electronic component; and sending a positioning command to the control computer, wherein the positioning command comprises the scalar value between the coordinates of the next electronic component and the coordinates of the at least one electronic component.

14. A storage medium having stored thereon instructions that, when executed by a processor of a computer, cause the processor to perform a method for testing a characteristic impedance of at least one electronic component of an electronic device, the method comprising:

setting test parameters of the at least one electronic component on the electronic device, and storing the test parameters in a storage of a test computer, the test parameters comprising coordinates of at least one electronic components, a standard characteristic impedance of the at least one electronic component, and a preset storing path to store measured data of the at least one electronic component;

reading the coordinates of the at least one electronic component by the test computer;

sending a positioning command from the test computer to a control computer through a switch according to the coordinates of the at least one electronic component on the electronic device;

driving a probe holder of a mechanical arm by the control computer according to the positioning command, so as to position probes of a time domain reflectometer (TDR) to a position of the at least one electronic component on the electronic device;

returning measured data of the characteristic impedance of the at least one electronic component collected by the TDR to the test computer through the switch, if the probes are positioned accurately;

comparing the measured data of the at least one electronic component with the standard characteristic impedance of the at least one electronic component, so as to determine if the measured data of the at least one electronic component is acceptable; and generating a test report for storing the measured data and the determined results, and storing the test report according to the preset storing path.

15. The storage medium according to claim 14, wherein sending a positioning command to the control computer according to the coordinates of the at least one electronic component on the electronic device comprises:

calculating a scalar value between the coordinates of the at least one electronic component and an origin of a coordinate system, wherein the origin of the coordinate system is positioned at a center point of the electronic device, and an initial position of the probe holder is positioned at the origin of the coordinate system; and sending the positioning command to the control computer, wherein the positioning command comprises the scalar value between the coordinates of the at least one electronic component and the origin of the coordinate system.

16. The storage medium according to claim 14, wherein a procedure to determine if the probes are positioned accurately comprises:

determining that the probes are positioned accurately if the test computer receives the characteristic impedance of the at least one electronic component collected by the TDR within a preset time interval; and determining that the probes are not positioned accurately if the test computer does not receive the characteristic impedance of the at least one electronic component collected by the TDR within the preset time interval.

17. The storage medium according to claim 14, further comprising:

setting a repeat count for re-positioning the probes to the position of the at least one electronic component, and setting predetermined move directions for re-positioning the probes;

calculating new coordinates of the at least one electronic component on the electronic device if the probes are not positioned accurately, and sending a positioning command to the control computer according to the new coordinates of the at least one electronic component, so as to drive the probe holder of the mechanical arm to position the probes of the TDR to a new position of the at least one electronic component; and outputting position failure information if the probes are not positioned accurately when the repeat count reaches.

18. The storage medium according to claim 17, wherein calculating new coordinates of the at least one electronic component on the electronic device comprises:

moving the probes by a preset distance from an X-axis coordinate of a current position of the at least one electronic component along the X-axis according to a predetermined move direction, so as to obtain a new X-axis coordinate of the at least one electronic component; and moving the probes by the preset distance from a Y-axis coordinate of the current position of the at least one electronic component along the Y-axis according to the predetermined move direction, so as to obtain a new Y-axis coordinate of the at least one electronic component.

19. The storage medium according to claim 14, further comprising:

obtaining coordinates of a next electronic component when the at least one electronic component has been tested if the electronic device comprises two or more electronic components to be tested, and calculating a scalar value between the coordinates of the next electronic component and coordinates of the at least one electronic component; and sending a positioning command to the control computer, wherein the positioning command comprises the scalar value between the coordinates of the next electronic component and the coordinates of the at least one electronic component.

20. The storage medium according to claim 14, wherein the medium is selected from the group consisting of a hard disk drive, a compact disc, a digital video disc, and a tape drive.

* * * * *